United States Patent
Chang et al.

(10) Patent No.: US 11,214,284 B2
(45) Date of Patent: Jan. 4, 2022

(54) CARGO TRANSPORTING VEHICLE

(71) Applicant: LAB TO MARKET INC., Seoul (KR)

(72) Inventors: Yoon Seok Chang, Seoul (KR); Nam Uook Kim, Paju-si (KR); Jeong In Lee, Seoul (KR)

(73) Assignee: LAB TO MARKET INC., Seoul (KR)

( * ) Notice: Subject to any disclaimer, the term of this patent is extended or adjusted under 35 U.S.C. 154(b) by 0 days.

(21) Appl. No.: 17/097,989

(22) Filed: Nov. 13, 2020

(65) Prior Publication Data

US 2021/0253144 A1    Aug. 19, 2021

(30) Foreign Application Priority Data

Feb. 14, 2020   (KR) .................. 10-2020-0018095

(51) Int. Cl.
| | | |
|---|---|---|
| *B61F 13/00* | (2006.01) | |
| *H01L 21/677* | (2006.01) | |
| *B65G 49/06* | (2006.01) | |
| *B65G 35/06* | (2006.01) | |

(52) U.S. Cl.
CPC .............. *B61F 13/00* (2013.01); *B65G 35/06* (2013.01); *B65G 49/061* (2013.01); *H01L 21/67706* (2013.01); *H01L 21/67724* (2013.01); *B65G 2201/0297* (2013.01)

(58) Field of Classification Search
CPC ....... B61F 13/00; B65G 49/061; B65G 35/06; H01L 21/67706; H01L 21/67724
USPC ........................................ 414/663, 282, 279
See application file for complete search history.

(56) References Cited

U.S. PATENT DOCUMENTS

| | | |
|---|---|---|
| 9,659,802 B2 | 5/2017 | Wang et al. |
| 2015/0197400 A1* | 7/2015 | Kinugawa ......... H01L 21/67736 414/458 |
| 2018/0022547 A1* | 1/2018 | Wehner ................ B65G 1/0492 414/279 |

FOREIGN PATENT DOCUMENTS

| | | |
|---|---|---|
| JP | 2012-184085 A | 9/2012 |
| JP | 2016-175506 A | 10/2016 |
| KR | 10-2012-0079600 A | 7/2012 |
| KR | 10-1673919 B1 | 11/2016 |
| KR | 10-1831172 B1 | 2/2018 |
| KR | 10 1924724 B1 | 12/2018 |
| KR | 10-2066431 B1 | 1/2020 |

OTHER PUBLICATIONS

Korean Notice of Final Rejection dated Sep. 24, 2021, issued to the counterpart Korean Patent Application No. 10-2020-0018095.

* cited by examiner

*Primary Examiner* — Saul Rodriguez
*Assistant Examiner* — Willie Berry, Jr.
(74) *Attorney, Agent, or Firm* — Stein IP, LLC

(57) ABSTRACT

A cargo transporting vehicle configured to travel along a path of a work site is provided. The cargo transporting vehicle includes: a traveling unit configured to travel on the path; a plate configured to load a cargo thereon; a loading unit including at least an articulated arm structure in which a width and an extendable length are adjusted according to dimensions of the cargo, the articulated arm structure being configured to load and unload the cargo onto and from the plate; and a plate lifting unit configured to raise or lower the plate.

18 Claims, 14 Drawing Sheets

FIG. 14
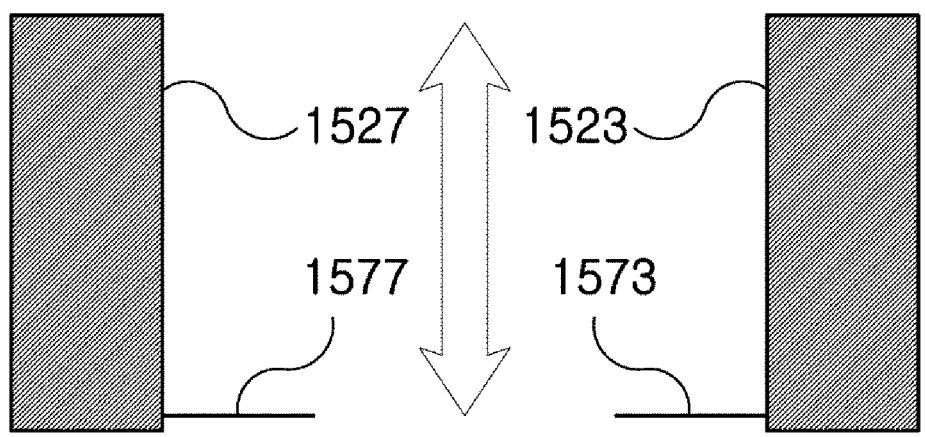
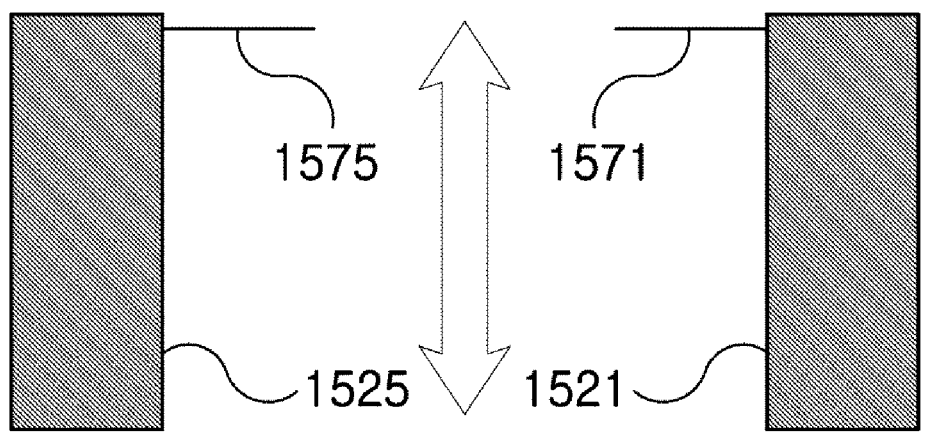

CARGO TRANSPORTING VEHICLE

CROSS-REFERENCE TO RELATED PATENT APPLICATION

This non-provisional U.S. patent application claims priority under 35 U.S.C. § 119 of Korean Patent Application No. 10-2020-0018095, filed on Feb. 14, 2020, in the Korean Intellectual Property Office, the entire contents of which are hereby incorporated by reference.

BACKGROUND

1. Field

The present disclosure relates to a cargo transporting vehicle.

2. Description of the Related Art

In order to transport a cargo within a work site, an automated material handling system may be used. For example, in semiconductor manufacturing facilities, an automated material handling system including a transport conveyor, an overhead hoist transport (OHT) and an overhead shuttle (OHS) may be used in order to transfer a wafer carrier containing a substrate(s) that is in the progress of manufacturing processes. In particular, the OHT and the OHS can transfer the wafer carrier along a path in the work site, for example, on rails installed on a ceiling of the work site. Therefore, the wafer carrier can be smoothly transferred without overlapping with the movements of equipments or ground distribution apparatuses installed in the work site.

For example, U.S. Pat. No. 9,659,802, entitled "Method for overhead cross-system transportation", filed by Taiwan Semiconductor Manufacturing Company and registered on May 23, 2017, discloses a method of transferring a wafer carrier among a conveyor, the OHT and the OHS.

In the automated material handling system, a cargo transporting vehicle may be used. For example, the cargo transporting vehicle travels on the rail while a cargo such as a tote box as well as the wafer carrier is loaded thereon, or the cargo transporting vehicle loading no cargo thereon travels on the rail to load a cargo at a specific location.

In order for the cargo transporting vehicle to operate normally, the maintenance of the cargo transporting vehicle needs to be appropriately conducted. For example, the cargo transporting vehicle may include a traveling unit that is constituted by, for example, a motor, a shaft, a timing belt and wheels. The maintenance of the traveling unit needs to be appropriately conducted. For example, when the timing belt is loosened, the shaft is bent, or a wheel slip occurs due to, e.g., the wear of the wheels, it is difficult for the cargo transporting vehicle to operate normally. Further, when the traveling unit of the cargo transporting vehicle is raised or lowered as necessary between a storage position and a traveling position, the loosening of the timing belt and the bending of the shaft occur more frequently. If the timing belt is loosened, in a conventional case, the timing belt is tightened again after the traveling unit is disassembled. Similarly, if the shaft is bent, the shaft is reassembled after the traveling unit is disassembled.

Meanwhile, in the conventional case, in order to load a cargo having the standard size from a cargo storage rack or unload the cargo to the cargo storage rack, the cargo transporting vehicle may include a loading unit constituted by, for example, extendable/contractible arms and a contact part that comes into contact with the cargo. However, the conventional loading unit cannot adjust the width between the arms because the conventional loading unit loads or unloads the cargo having the standard size, for example. In order to load or unload various types of cargo, it is necessary to adjust the width between the arms of the cargo transporting vehicle depending on the size of the cargo.

Further, in the conventional case, although the cargo transporting vehicle may load or unload the cargo to or from, for example, the cargo storage rack, the cargo cannot be loaded or unloaded at a location desired by an operator at the work site. For example, it is not possible to directly load or unload the cargo at a location designated by the operator below the rail, and a configuration such as a hoist or a cross-system transport is required. Therefore, the configuration of the automated material handling system becomes complicated.

RELATED ART

Patent Document 1: U.S. Pat. No. 9,659,802.

SUMMARY

In view of the above, the present disclosure provides a cargo transporting vehicle capable of easily performing maintenance of a traveling unit, minimizing the possibility of damage to the traveling unit, and stably loading, unloading, or moving up and down cargos having different sizes.

In accordance with an aspect of the present disclosure, there is provided a cargo transporting vehicle configured to travel along a path of a work site, the cargo transporting vehicle including: a traveling unit configured to travel on the path; a plate configured to load a cargo thereon; a loading unit including at least an articulated arm structure in which a width and an extendable length are adjusted according to dimensions of the cargo, the articulated arm structure being configured to load and unload the cargo onto and from the plate; and a plate lifting unit configured to raise or lower the plate.

BRIEF DESCRIPTION OF THE DRAWINGS

FIG. 14 shows a schematic configuration of a first drum to a fourth drum of the plate lifting unit according to the embodiment.

DETAILED DESCRIPTION

Figure 1:
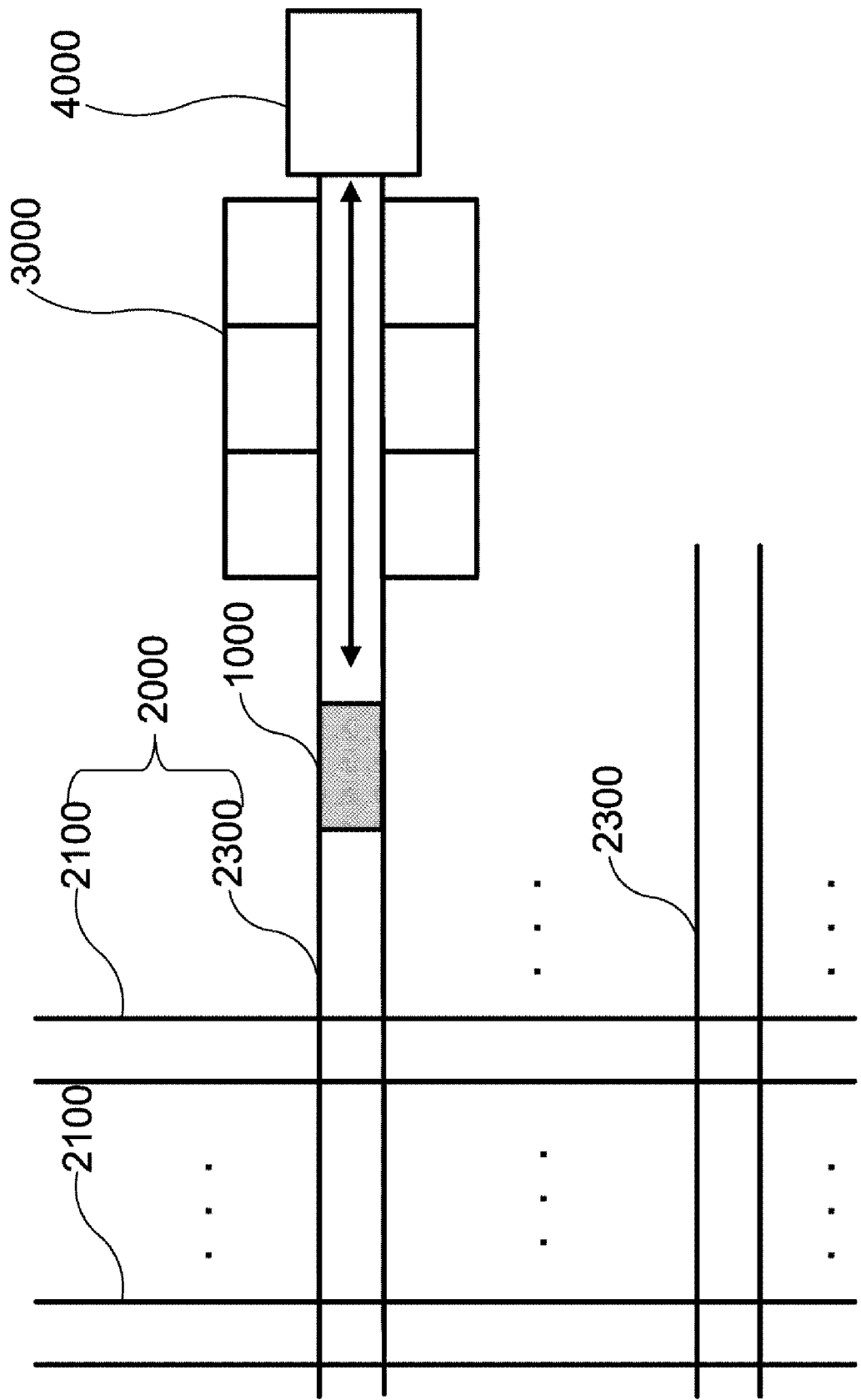
FIG. 1 is a plan view showing a system environment to which a cargo transporting vehicle according to an embodiment of the present disclosure is applied.

Hereinafter, embodiments of a cargo transporting vehicle according to the techniques of the present disclosure will be described in detail with reference to the accompanying drawings. Meanwhile, in the drawings for describing the embodiments of the techniques of the present disclosure, for the sake of convenience of description, only a part of the practical configurations may be illustrated or the practical configurations may be illustrated while a part of the practical configurations is omitted or changed. Further, relative dimensions and proportions of parts therein may be exaggerated or reduced in size.

Embodiment

FIG. 1 is a plan view showing a system environment to which a cargo transporting vehicle according to an embodiment of the present disclosure is applied.

Referring to FIG. 1, the system environment may include a cargo transporting vehicle 1000, a path 2000 and a cargo storage rack 3000. Further, referring to FIG. 1, the system environment may further include a charging device 4000.

The cargo transporting vehicle 1000 is configured to move on the path 2000 of a work site. The detailed configuration of the cargo transporting vehicle 1000 will be described later.

The path 2000 is disposed in the work site. For example, the path 2000 may include a rail installed at a ceiling of the work site. Alternatively, the path 2000 may include a physical rail or a track installed at the work site or a virtual path of the work site. Preferably, the path 2000 may include a first path 2100 and a second path 2300 intersecting the first path 2100.

The first path 2100 and the second path 2300 may be installed in grid form at the ceiling of the work site, for example. Accordingly, the cargo transporting vehicle 1000 may move to various locations in the work site through the first path 2100 and the second path 2300 installed in grid form. Further, through the first path 2100 and the second path 2300 installed in grid form, for example, the cargo transporting vehicle 1000 can bypass and move to a target position if another cargo transporting vehicle stops moving due to a malfunction or is stopped in order to lower the cargo on the path 2000.

The cargo transporting vehicle 1000 may travel on the first path 2100 through a first driving unit to be described later and may also travel on the second path 2300 through a second driving unit to be described later.

The widths of the first path 2100 and the second path 2300 may be the same or different from each other. When the widths of the first path 2100 and the second path 2300 are the same, the cargo transporting vehicle 1000 may travel on the first path 2100 and the second path 2300 only through the first driving unit to be described later or only through the second driving unit to be described later.

Figure 3A:
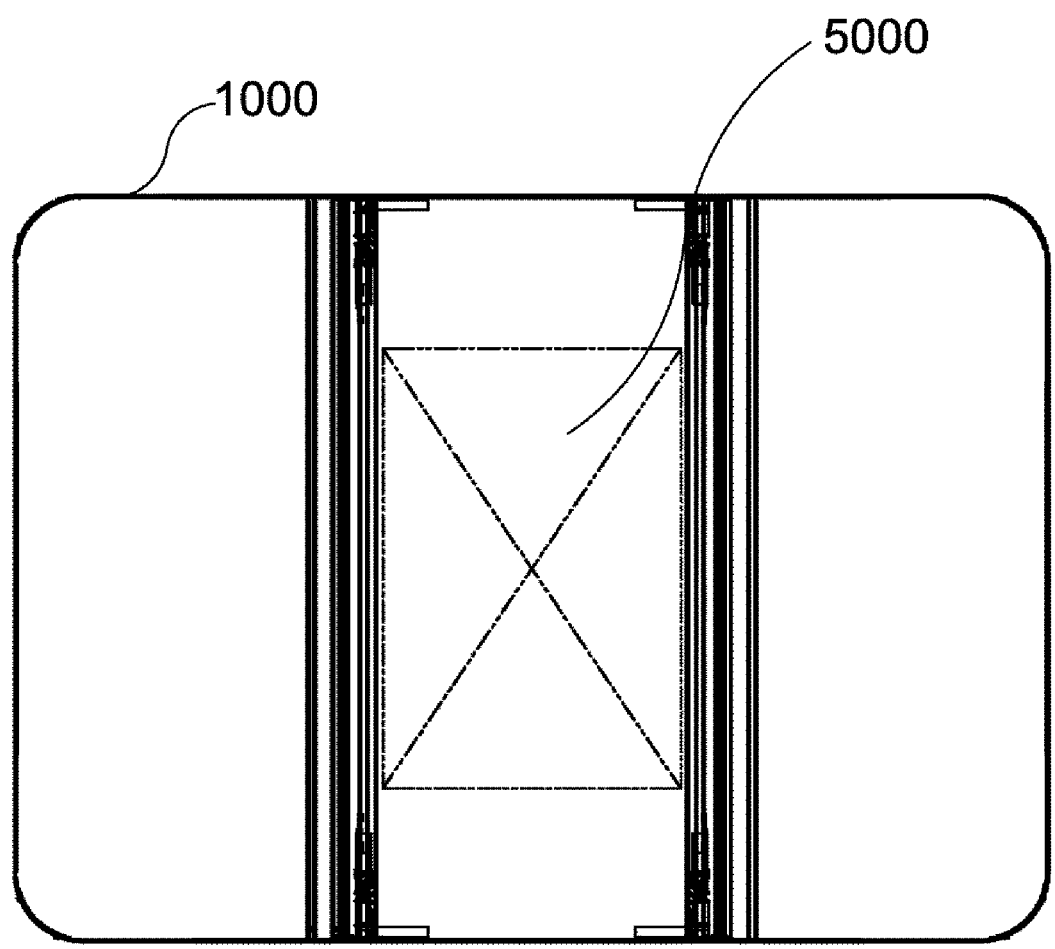
FIGS. 3A and 3B are schematic views showing the exemplary configuration of the cargo transporting vehicle according to the embodiment.

The cargo storage rack 3000 is configured to store a cargo 5000 (see, e.g., FIG. 3A). The cargo 5000 may be configured in the form of, for example, a tote box. In the tote box, items such as necessary parts to be used in the work site can be stored. The cargo storage rack 3000 may include a plurality of racks arranged in multiple stages.

The charging device 4000 is configured to charge a battery 1800 (see, e.g., FIG. 2) of the cargo transporting vehicle 1000.

Figure 2:
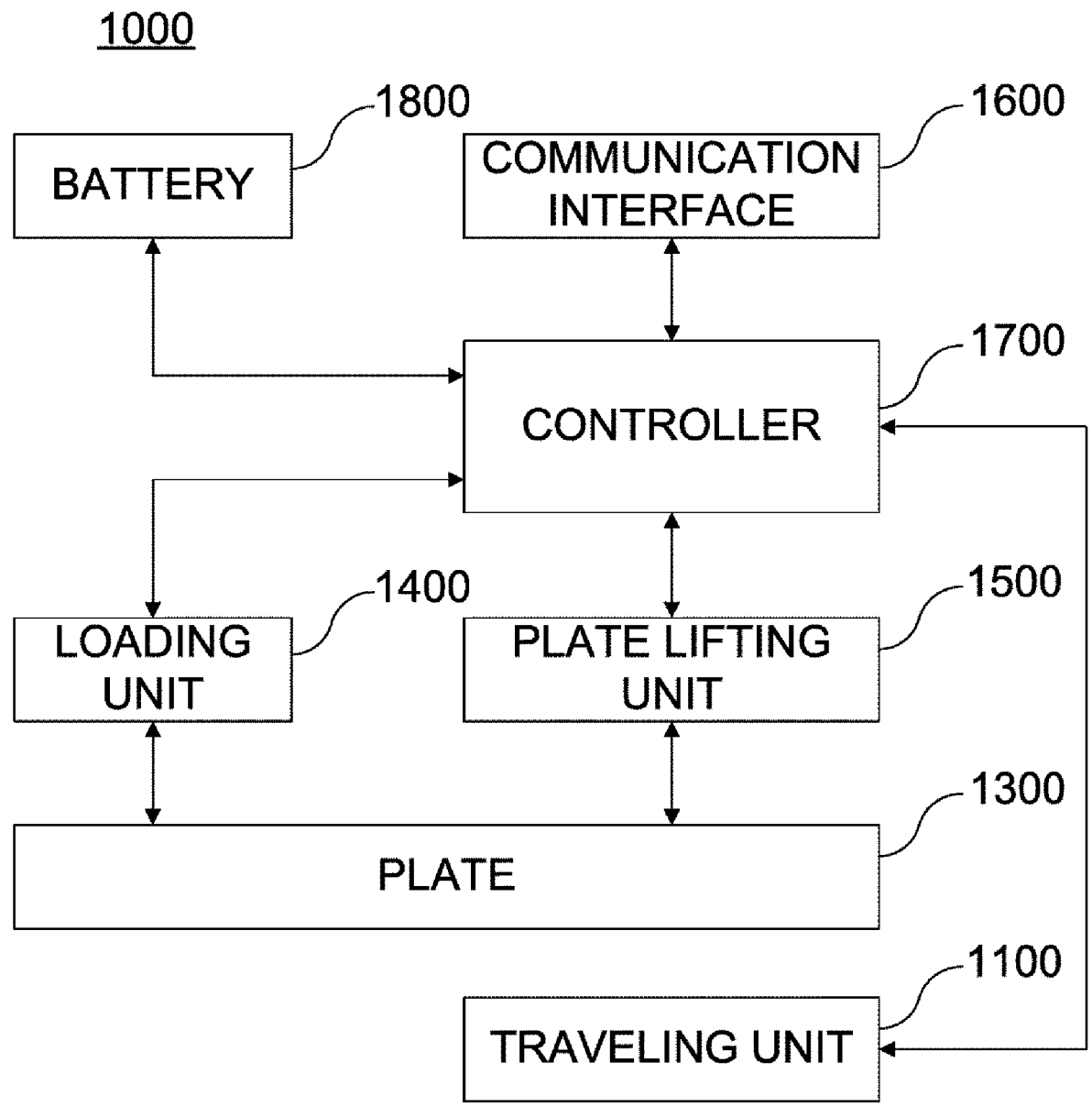
FIG. 2 is a block diagram showing an exemplary configuration of the cargo transporting vehicle according to the embodiment.

FIG. 2 is a block diagram showing an exemplary configuration of the cargo transporting vehicle 1000 according to the embodiment.

Referring to FIG. 2, the cargo transporting vehicle 1000 includes a traveling unit 1100, a plate 1300, a loading unit 1400, and a plate lifting unit 1500. In addition, referring to FIG. 2, the cargo transporting vehicle 1000 includes a communication interface 1600, a controller 1700 and the battery 1800.

The traveling unit 1100 is configured to travel on the path 2000. The detailed configuration of the traveling unit 1100 will be described later.

The plate 1300 is configured to load the cargo 5000 thereon.

The loading unit 1400 includes at least an articulated arm structure in which a width and an extendable length are adjusted according to the dimensions of the cargo 5000, and the articulated arm structure is configured to load and unload the cargo 5000 onto and from the plate 1300.

The plate lifting unit 1500 is configured to raise or lower the plate 1300.

The communication interface 1600 is configured to provide a communication interface between the cargo transporting vehicle 1000 and an external device (not shown). For example, the cargo transporting vehicle 1000 may receive a transport command from the external device through the communication interface 1600. The communication interface 1600 may be implemented using, for example, semiconductor devices such as communication chips.

The controller 1700 is configured to control the operation of the traveling unit 1100, the loading unit 1400 and the plate lifting unit 1500 based on the transport command received through the communication interface 1600. The controller 1700 may be implemented using, for example, a semiconductor device such as a CPU.

The battery 1800 is configured to supply power to the traveling unit 1100, the loading unit 1400, the plate lifting unit 1500, the communication interface 1600 and the controller 1700.

Figure 3B:
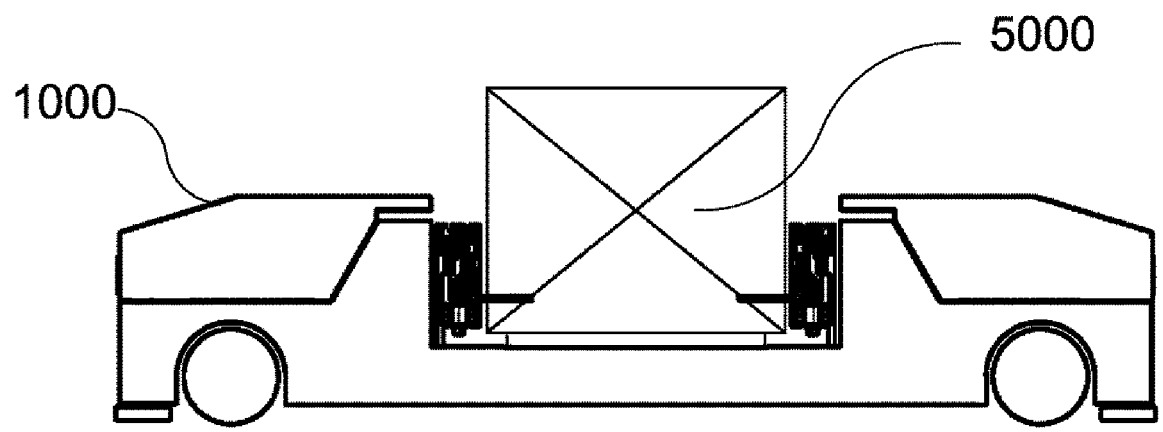
Figure 4A:
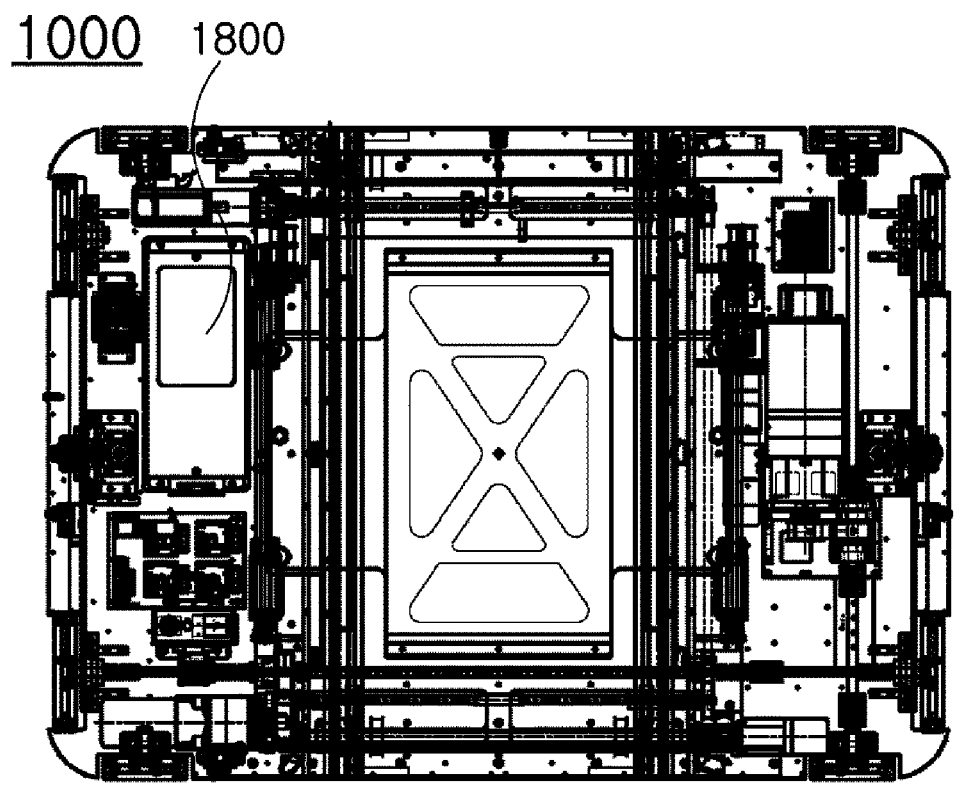
FIGS. 4A and 4B are perspective views showing the exemplary configuration of the cargo transporting vehicle according to the embodiment.
Figure 4B:
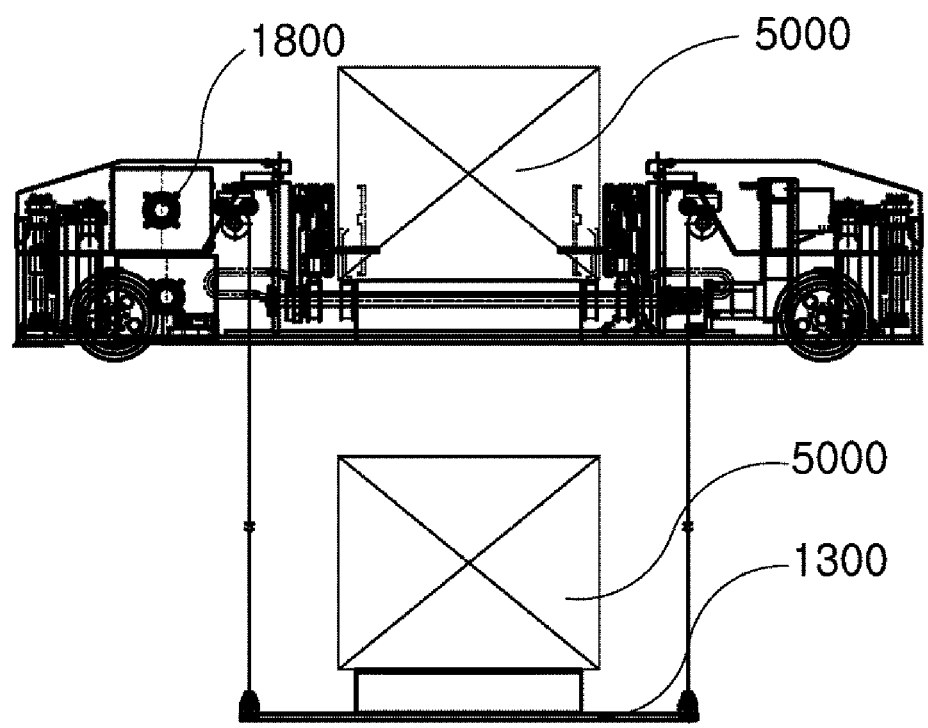

FIGS. 3A and 3B are schematic views showing the exemplary configuration of the cargo transporting vehicle 1000 according to the embodiment. Specifically, FIG. 3A is a plan view of the cargo transporting vehicle 1000, and FIG. 3B is a side view of the cargo transporting vehicle 1000. Further, FIGS. 4A and 4B are perspective views showing the exemplary configuration of the cargo transporting vehicle 1000 according to the embodiment. Specifically, FIG. 4A is a plan view of the cargo transporting vehicle 1000, and FIG. 4B is a side view of the cargo transporting vehicle 1000. In FIGS. 3A, 3B and 4B, a state in which the cargo 5000 is loaded in the cargo transporting vehicle 1000 is illustrated.

Figure 5A:
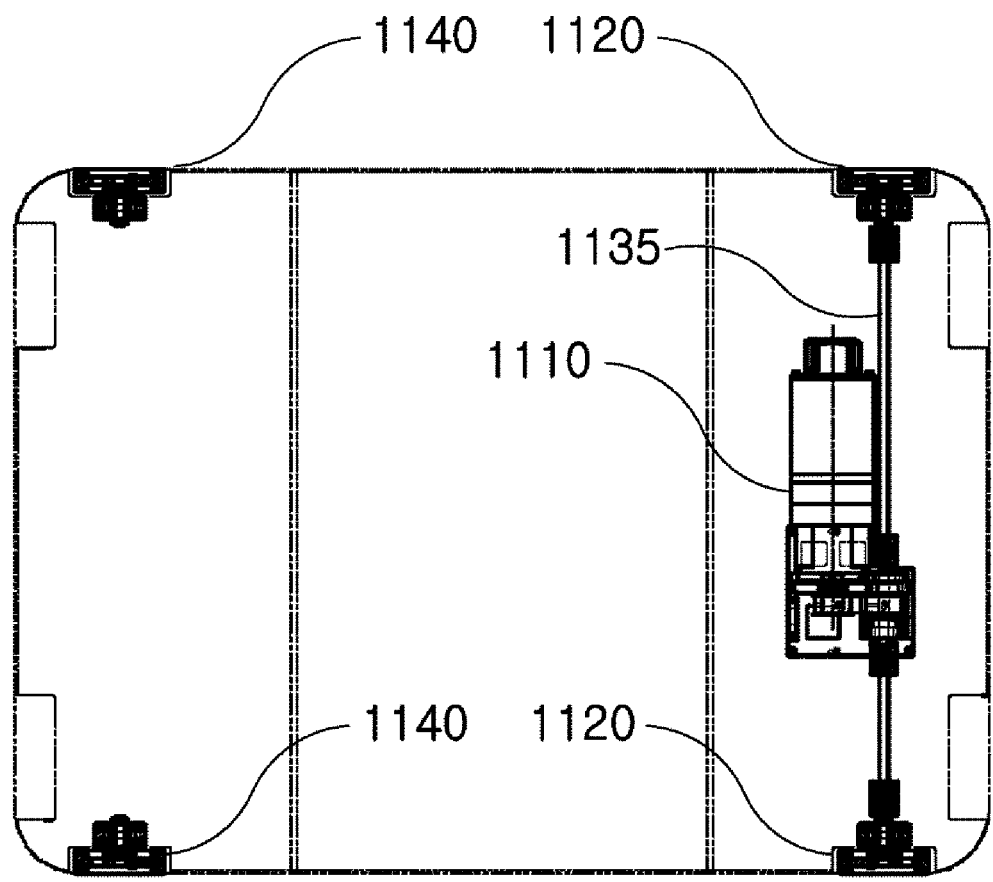
FIGS. 5A to 7C show an exemplary configuration of a traveling unit of the cargo transporting vehicle according to the embodiment.
Figure 7A:
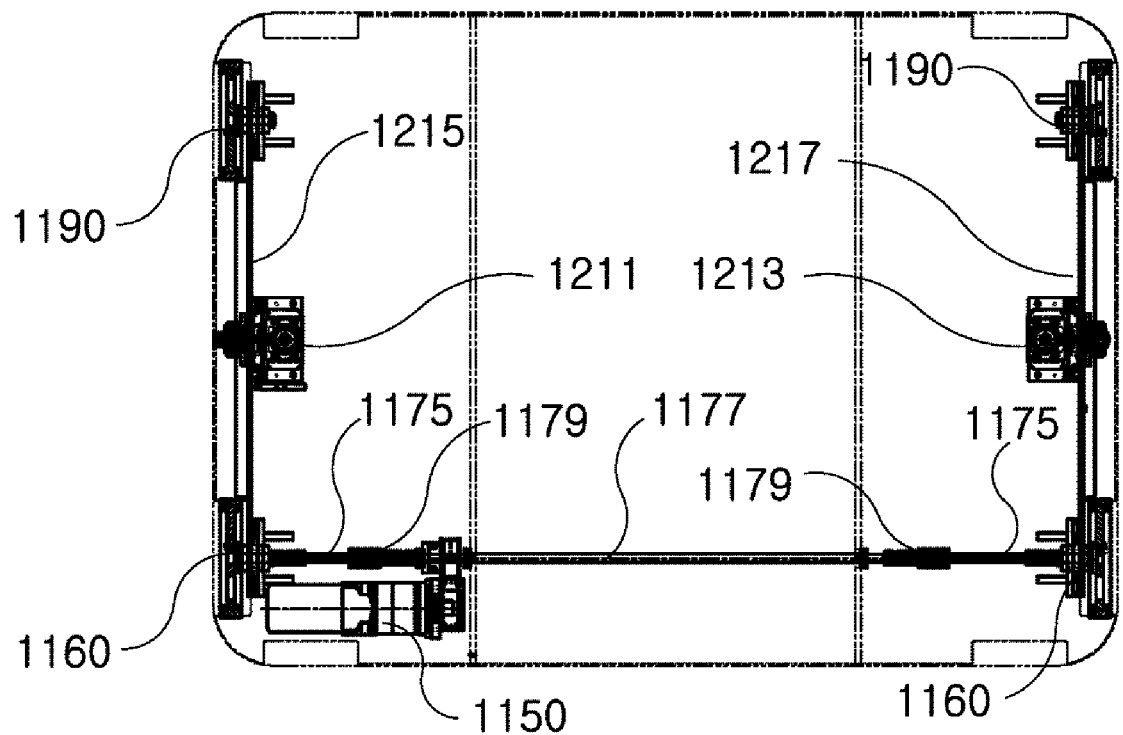
Figure 7B:
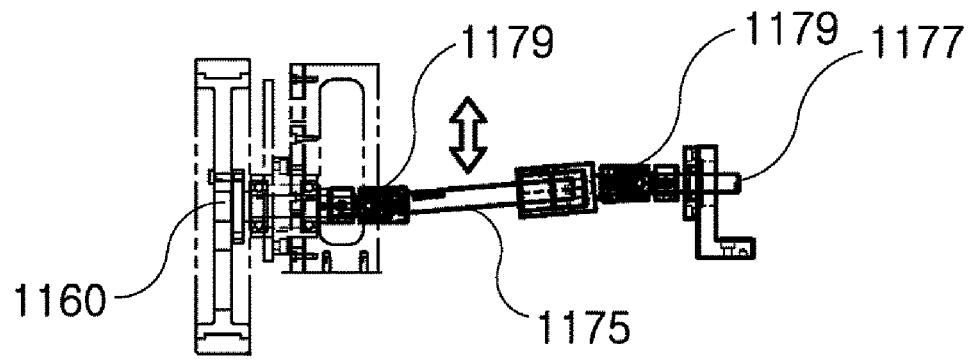
Figure 7C:
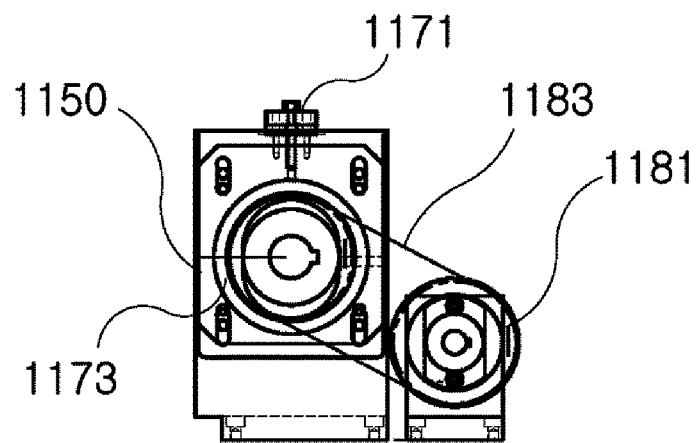

FIGS. 5A to 7C show an exemplary configuration of the traveling unit 1100 of the cargo transporting vehicle 1000 according to the embodiment. Specifically, FIG. 5A is a plan view of the first driving unit of the traveling unit 1100, and FIG. 5B is a side view of the first driving unit 1100. FIG. 6A is an enlarged plan view of a part of the first driving unit, FIG. 6B is an enlarged side view of the part of the first driving unit, and FIG. 6C is another side view of the part of the first driving unit. FIG. 7A is a plan view of the second driving unit of the traveling unit 1100, FIG. 7B is an enlarged side view of a part of the second driving unit, and FIG. 7C is an enlarged side view of another part of the second driving unit. FIGS. 5A to 7C mainly show a configuration of the traveling unit 1100 in the perspective view of the cargo transporting vehicle 1000 shown in FIGS. 4A and 4B. Therefore, in FIGS. 5A to 7C, only some parts of the cargo transporting vehicle 1000 are indicated by reference numerals for the sake of convenience of illustration.

Figure 5B:
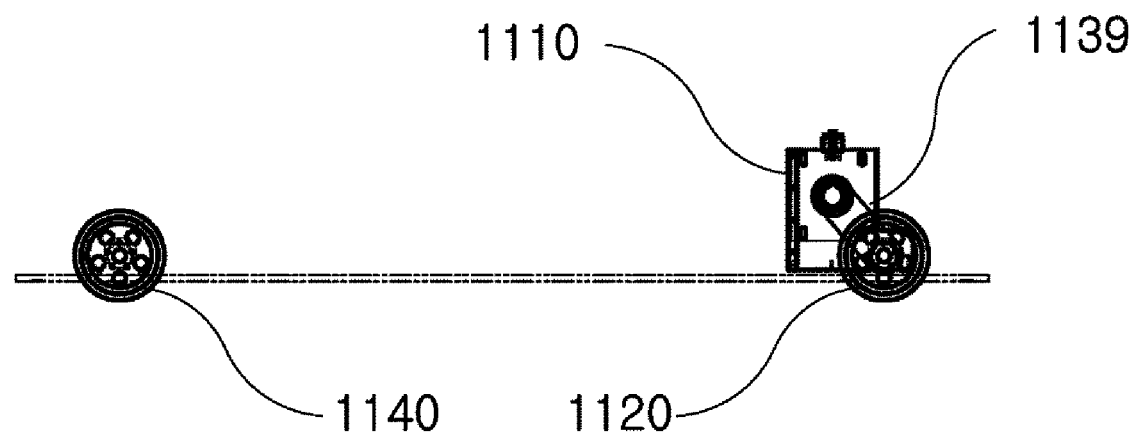
Figure 6A:
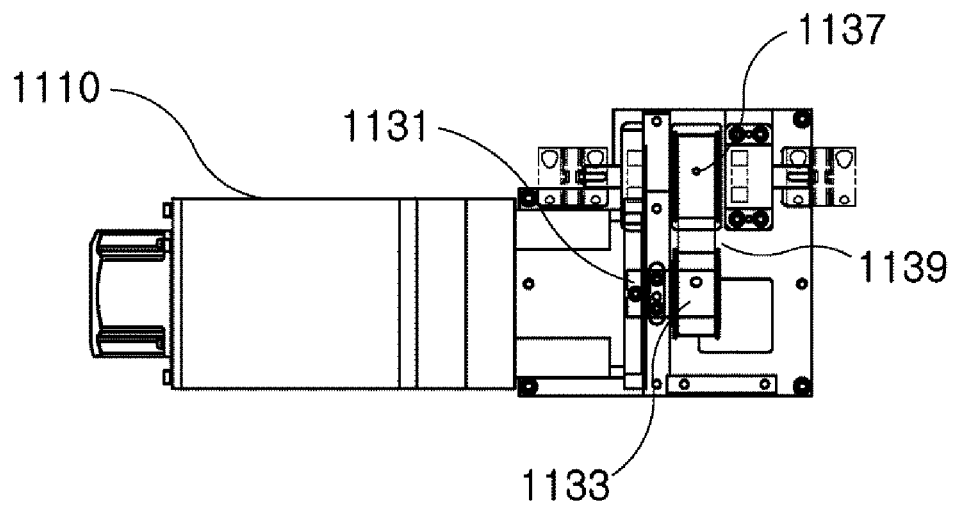
Figure 6B:
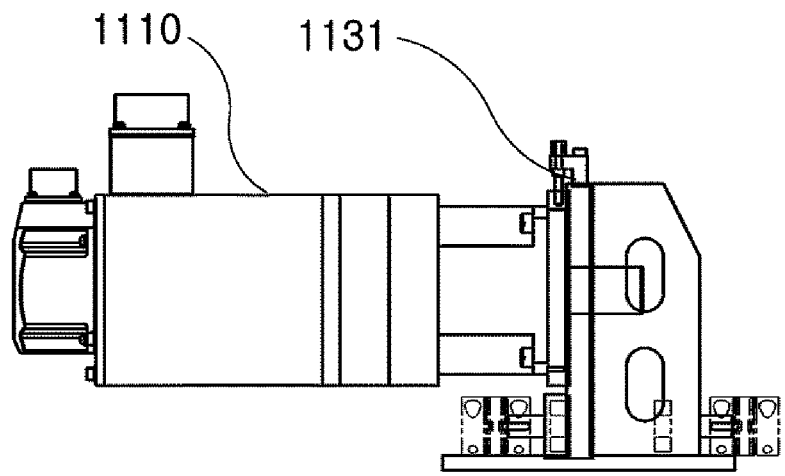
Figure 6C:
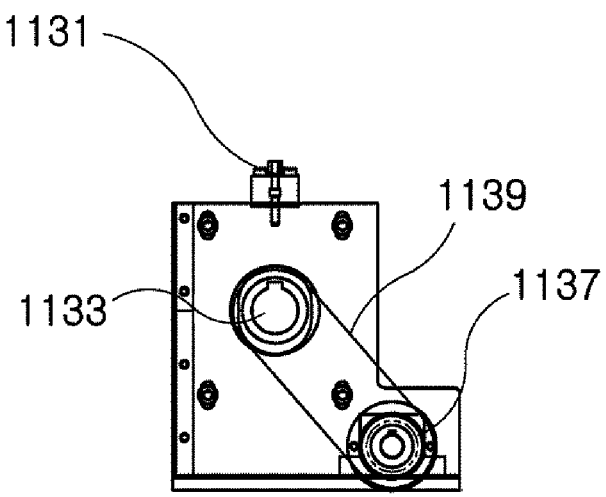

Referring to FIGS. 5A and 5B, the traveling unit 1100 includes the first driving unit. The first driving unit is configured to travel on the first path 2100.

Referring to FIGS. 5A and 5B, the first driving unit includes a first motor 1110, a pair of first wheels 1120, a first connection structure for transmitting the rotational force from the first motor 1100 to the pair of first wheels 1120, and a pair of second wheels 1140 disposed at a different position from the position of the pair of first wheels 1120.

The first motor 1110 operates based on power supplied from the battery 1800.

One of the first wheels 1120 is disposed at a first side of the cargo transporting vehicle 1000 and the other one of the first wheels 1120 is disposed at a second side of the cargo transfer vehicle 1000 facing the first side. One of the second wheels 1140 is disposed at the first side and the other one of the second wheels 1140 is disposed at the second side facing the first side while the pair of second wheels 1140 is disposed at a different position from the position of the pair of first wheels 1120. It is preferable that the shape of the pair of second wheels 1140 is the same as that of the pair of first wheels 1120.

The first connection structure includes at least a first height adjustment mechanism 1131 configured to adjust the relative height of the first motor 1110 with respect to the pair of first wheels 1120. For example, the first height adjustment mechanism 1131 raises or lowers the relative position of the first motor 1110 by turning an adjustment knob. Accordingly, the distance (height) of the first motor 1110 with respect to the pair of first wheels 1120 may increase or decrease. Further, when a first timing belt 1139 to be described later is loosened, causing the first driving unit not to operate normally, the first height adjustment mechanism 1131 can be used to tighten the first timing belt 1139 without entirely disassembling and reassembling the first driving unit. Therefore, the maintenance of the first driving unit can be easily performed.

For example, the first connection structure may further include: a first pulley 1133 connected to the first motor 1110; a first wheel shaft 1135 connecting the pair of first wheels 1120; a second pulley 1137 connected to the first wheel shaft 1135; and a first timing belt 1139 connecting the first pulley 1133 and the second pulley 1137. The first height adjustment mechanism 1131 is connected to the first motor 1110 and the first pulley 1133 to adjust the heights of the first motor 1110 and the first pulley 1133.

For example, the first height adjustment mechanism 1131 may include: a first plate (not shown) connected to the first motor 1110 and the first pulley 1133; a fixed second plate (not shown) connected to the first plate; and an adjustment knob configured to adjust the height of the first plate with respect to the second plate. The above configuration is merely an example, and the first connection structure may be constituted by other components as long as the rotational force from the first motor 1100 can be transmitted to the pair of first wheels 1120. However, the first connection structure necessarily includes the first height adjustment mechanism 1131 that adjusts the relative height of the first motor 1110 with respect to the pair of first wheels 1120.

Further, the pair of second wheels 1140 may be connected by a wheel shaft (not shown).

As described above, the path 2000 includes the first path 2100 and the second path 2300 intersecting the first path 2100, and the traveling unit 1100 may further include the second driving unit configured to travel on the second path 2300.

Referring to FIGS. 7A to 7C, the second driving unit includes: a second motor 1150; a pair of third wheels 1160; a second connection structure for transmitting the rotational force from the second motor 1150 to the pair of third wheels 1160; and a pair of fourth wheels 1190 that has the same shape as the pair of third wheels 1160 and is disposed at a different position from the position of the pair of third wheels 1160.

The second motor 1150 operates based on power supplied from the battery 1800. One of the third wheels 1160 is disposed at a third side of the cargo transporting vehicle 1000 and the other one of the third wheels 1160 is disposed at a fourth side of the cargo transporting vehicle 1000 facing the third side. One of the fourth wheels 1190 is disposed at the third side and the other one of the fourth wheels 1190 is disposed at the fourth side facing the third side while the pair of fourth wheels 1160 is disposed at a different position from the position of the pair of third wheels 1160. It is preferable that the shape of the pair of fourth wheels 1190 is the same as that of the pair of third wheels 1160.

The second connection structure includes at least a second height adjustment mechanism 1171 configured to adjust the relative height of the second motor 1150 with respect to the pair of third wheels 1160. For example, the second height adjustment mechanism 1171 raises or lowers the relative position of the second motor 1150 by turning an adjustment knob. Accordingly, the distance (height) of the second motor 1150 with respect to the third wheels 1160 may increase or decrease. Further, when a second timing belt 1183 to be described later is loosened, causing the second driving unit not to operate normally, the second height adjustment mechanism 1171 can be used to tighten the second timing belt 1183 without entirely disassembling and reassembling the second driving unit. Therefore, the maintenance of the second driving unit can be easily performed.

Further, referring to FIGS. 7B and 7C, for example, the second connection structure may include: a third pulley 1173 connected to the second motor 1150; a pair of second wheel shafts 1175 respectively connected to the pair of third wheels 1160; a third wheel shaft 1177 connected between the pair of second wheel shafts 1175; a plurality of universal joints 1179 connecting the third wheel shaft 1177 and the pair of second wheel shafts 1175 to respectively connect the pair of second wheel shafts 1175 to the pair of third wheels 1160; a fourth pulley 1181 connected to the third wheel shaft 1177; and the second timing belt 1183 connecting the third pulley 1173 and the fourth pulley 1181.

The second height adjustment mechanism 1171 is connected to the second motor 1150 and the third pulley 1173 to adjust the heights of the second motor 1150 and the third pulley 1173. Each of the plurality of universal joints 1179 is configured to transmit the rotational force. That is, for example, even when the third wheel shaft 1177 and the pair of second wheel shafts 1175 are not arranged on the same straight line, the plurality of universal joints 1179 can transmit the rotational force from the third wheel shaft 1177 to the pair of second wheel shafts 1175. Similarly, the plurality of universal joints 1179 can also transmit the rotational force from the pair of second wheel shafts 1175 to the pair of third wheels 1160.

For example, the second height adjustment mechanism 1171 may include: a first plate (not shown) connected to the second motor 1150 and the third pulley 1173; a fixed second plate (not shown) connected to the first plate; and an adjustment knob configured to adjust the height of the first plate with respect to the second plate. The above configuration is merely an example, and the second connection structure may be constituted by other components as long as the rotational force from the second motor 1150 can be transmitted to the pair of third wheels 1160. However, the second connection structure necessarily includes the second height adjustment mechanism 1171 that adjusts the relative height of the second motor 1150 with respect to the pair of third wheels 1160.

In addition to the first driving unit and the second driving unit, there may exist other units including a motor, a plurality of pulleys for transmitting the rotational force from the motor, and a timing belt connecting the plurality of pulleys. In this case, a height adjustment mechanism may be used to adjust the timing belt installed therein. Further, the pair of fourth wheels 1190 may also be connected through a wheel shaft (not shown).

The second driving unit may further include a second driving unit lifter that is connected to the pair of third wheels 1160 and the pair of fourth wheels 1190 to raise or lower between a traveling position and a storage position.

The second driving unit is configured to travel on the second path 2300. Therefore, only when the second driving unit is to travel on the second path 2300, the pair of third wheels 1160 and the pair of fourth wheels 1190 are lowered to the traveling position, and the pair of third wheels 1160 and the pair of fourth wheels 1190 are raised to the storage position in other cases.

For example, the second driving unit lifter may include: a third motor 1211; a fourth motor 1213; a first lifting structure 1215 connecting one of the third wheels 1160 and one of the fourth wheels 1190 and configured to raise or lower the one of the third wheels 1160 and the one of the fourth wheels 1190 between the traveling position and the storage position by using the third motor 1211; and a second lifting structure 1217 connecting the other one of the third wheels 1160 and the other of the fourth wheels 1190 and configured to raise or lower the other of the third wheels 1160 and the other of the fourth wheels 1190 between the traveling position and the storage position by using the fourth motor 1213. Each of the first lifting structure 1215 and the second lifting structure 1217 may be constituted by components such as bearings and LM guides. However, the employed components is not limited thereto as long as the components can be used to raise or lower the pair of third wheels 1160 and the pair of fourth wheels 1190 based on the rotational force transmitted from the corresponding motor.

Figure 8:
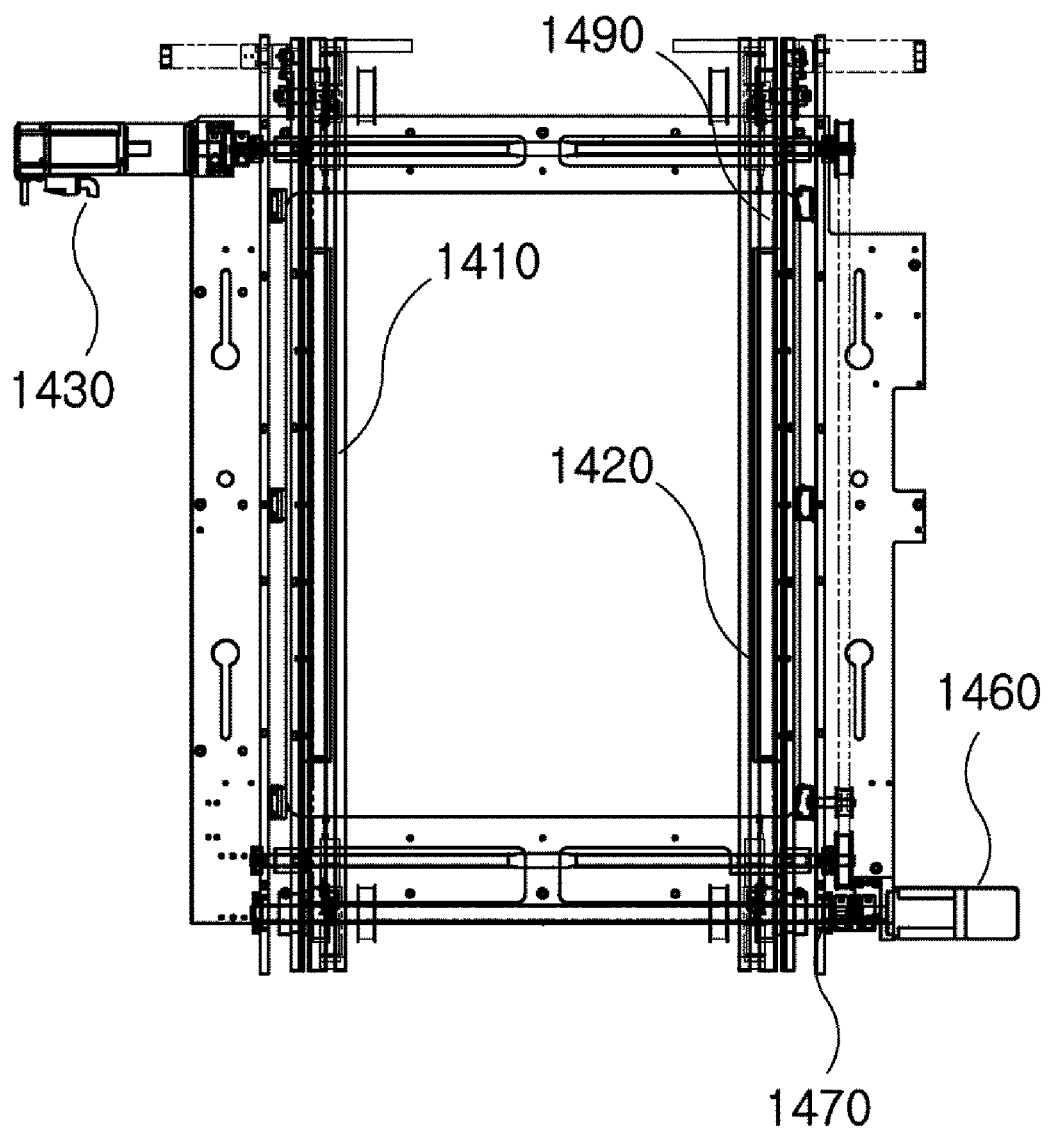
FIG. 8 shows an exemplary configuration of a loading unit of the cargo transporting vehicle according to the embodiment.

FIG. 8 is a plan view showing an exemplary configuration of the loading unit 1400 of the cargo transporting vehicle 1000 according to the embodiment.

Referring to FIG. 8, for example, as articulated arm structures, the loading unit 1400 of the cargo transporting vehicle 1000 includes a first arm structure 1410 and a second arm structure 1420 disposed to face the first arm structure 1410. In addition, the loading unit 1400 may further include: a width adjustment unit 1430 configured to adjust a width between the first arm structure 1410 and the second arm structure 1420; and a length adjustment unit configured to adjust a length of the first arm structure 1410 together with a length of the second arm structure 1420, wherein the first arm structure 1410 and the second arm structure 1420 are interlocked with each other.

Figure 9A:
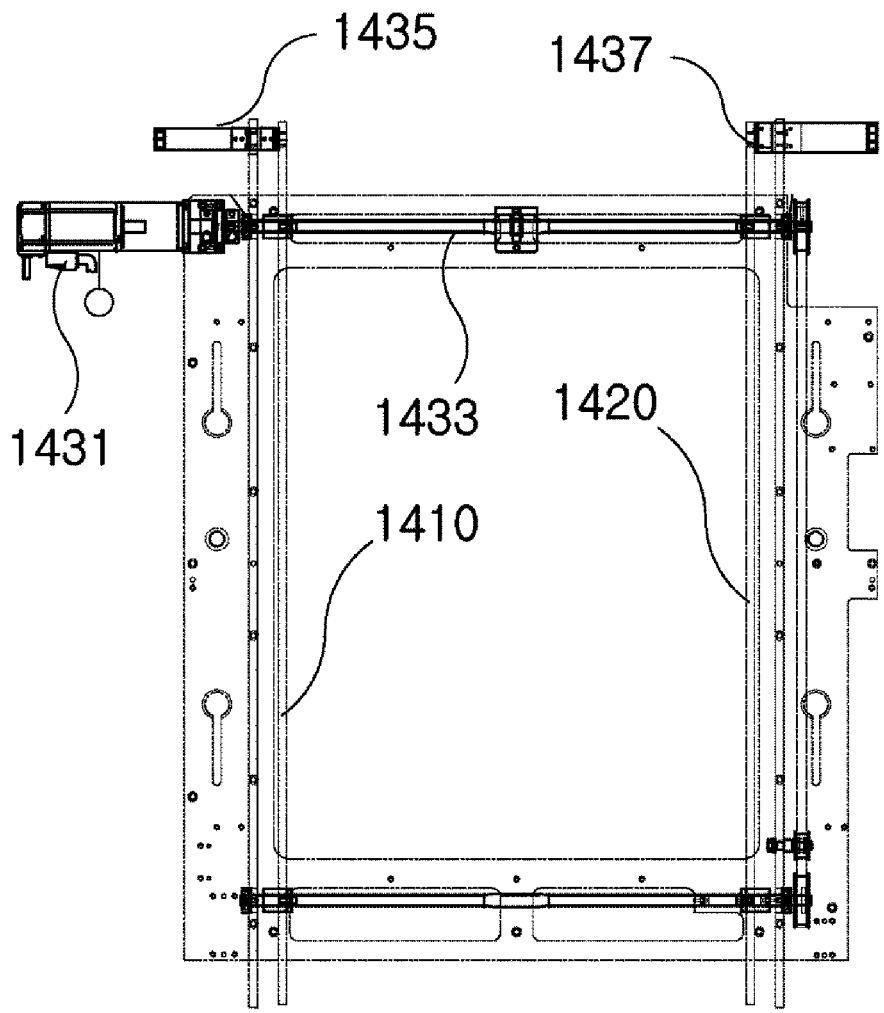
FIGS. 9A and 9B show an exemplary configuration of a width adjustment unit of the loading unit of the cargo transporting vehicle according to the embodiment.
Figure 9B:
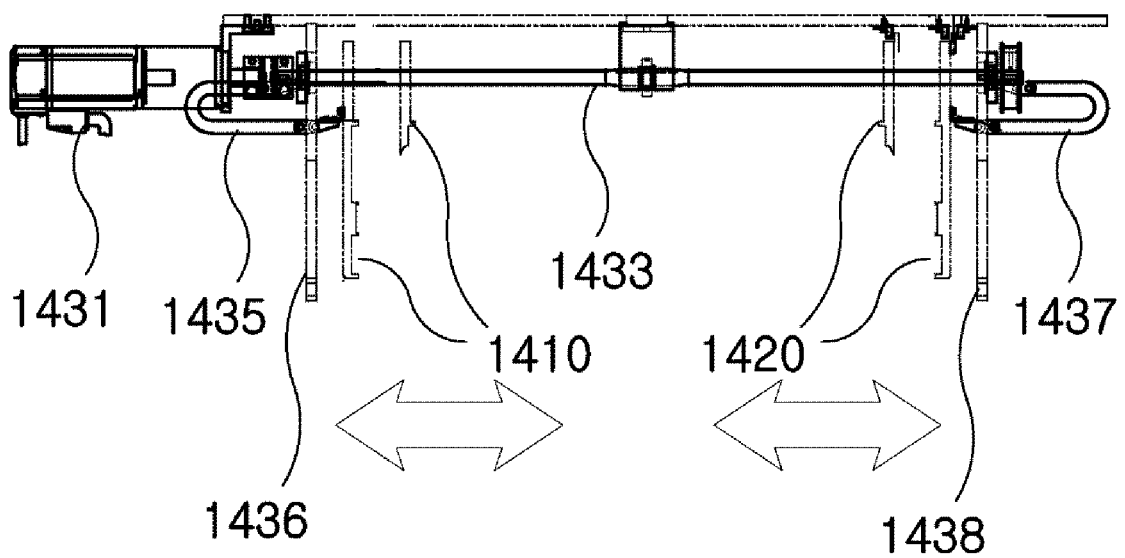

FIGS. 9A and 9B show an exemplary configuration of the width adjustment unit 1430 of the loading unit 1400 of the cargo transporting vehicle 1000 according to the embodiment. Specifically, FIG. 9A is a plan view of the width adjustment unit 1430, and FIG. 9B is a side view of the width adjustment unit 1430.

Referring to FIGS. 9A and 9B, for example, the width adjustment unit 1430 includes: a fifth motor 1431; a support shaft 1433 connected to the fifth motor 1431; a first cableveyor 1435 connected to the first arm structure 1410; and a second cableveyor 1437 connected to the second arm structure 1420. Each of the first cableveyor 1435 and second cableveyor 1437 accommodates cables in such a manner that the cables can be extended therein. Thus, even when the width between the first arm structure 1410 and the second arm structure 1420 is widened, it is possible to prevent the cables such as power cables and signal cables from being damaged. A first protective plate 1436 is disposed beside (outside) the first arm structure 1410 and a second protective plate 1438 is disposed beside (outside) the second arm structure 1420 to protect the first arm structure 1410 and the second arm structure 1420, respectively.

The first arm structure 1410 and the second arm structure 1420 are connected to the support shaft 1433 so as to be driven together in a direction closer to each other or in a direction away from each other with the rotation of the fifth motor 1431.

For example, the support shaft 1433 may include a first screw thread run in a first direction and a second screw thread run in a second direction opposite to the first direction. The first arm structure 1410 may be slidably disposed on the support shaft 1433 to move along the first screw thread, and the second arm structure 1420 may be slidably disposed on the support shaft 1433 to move along the second screw thread. Accordingly, the first arm structure 1410 and the second arm structure 1420 are driven together in a direction closer to each other or in a direction away from each other with the rotation of the fifth motor 1431.

The configuration of the above-described width adjustment unit 1430 is merely an example and is not limited thereto as long as the width between the first arm structure 1410 and the second arm structure 1420 can be adjusted.

Figure 10A:
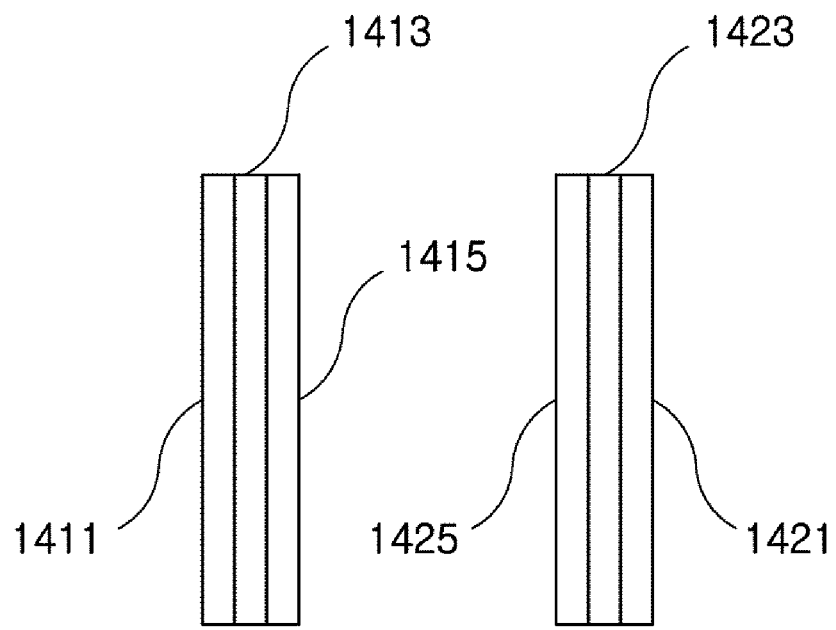
FIGS. 10A and 10B show exemplary driving states of a first arm structure and a second arm structure according to the embodiment.
Figure 10B:
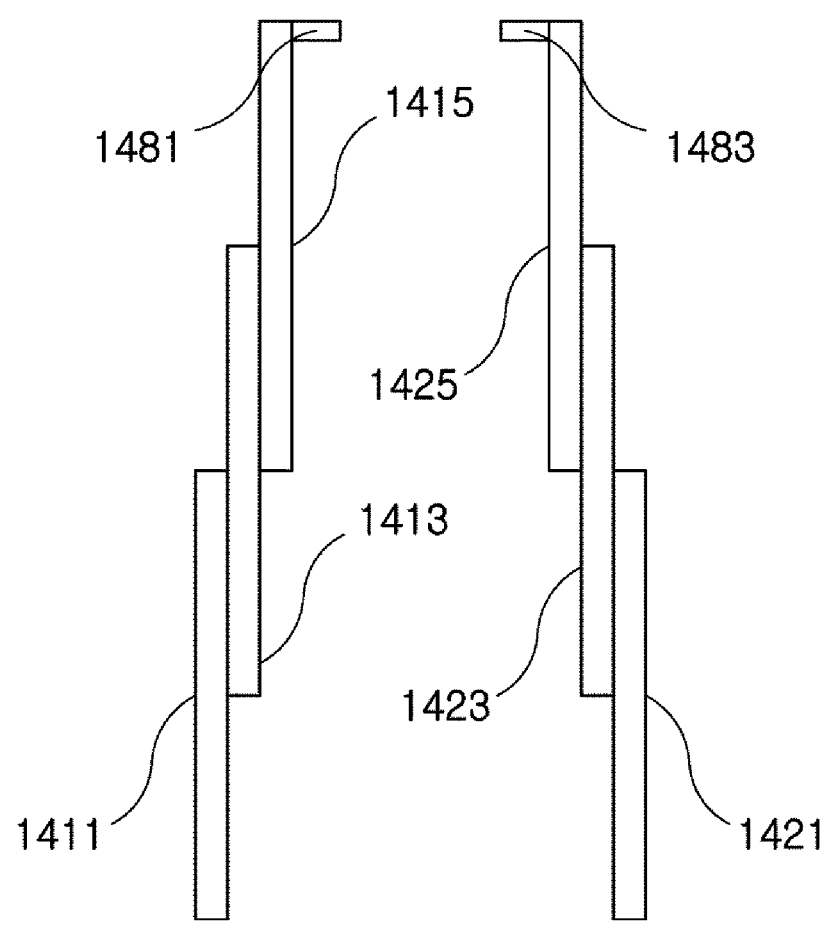
Figure 11A:
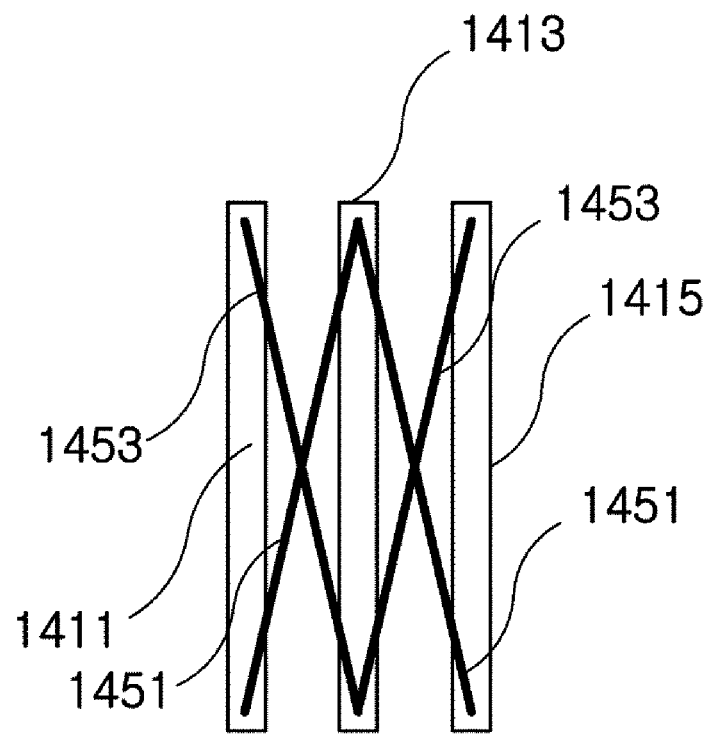
FIGS. 11A and 11B show exemplary connection states of multiple arms of the first arm structure and multiple arms of the second arm structure according to the embodiment.
Figure 11B:
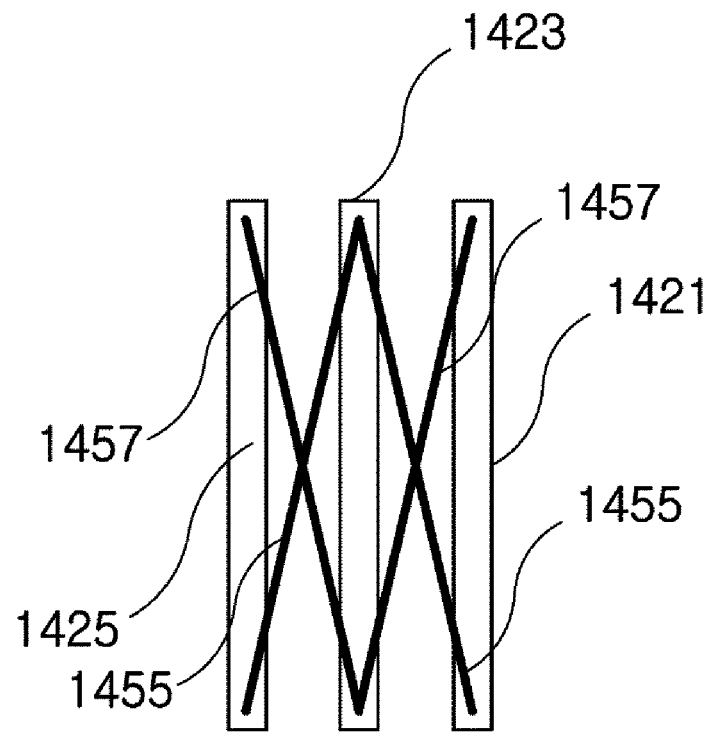

FIGS. 10A and 10B show exemplary driving states of the first arm structure 1410 and the second arm structure 1420 according to the embodiment. Specifically, FIG. 10A shows a state in which the first arm structure 1410 and the second arm structure 1420 are placed in their original positions, and FIG. 10B shows a state in which the first arm structure 1410 and the second arm structure 1420 are extended to the maximum extendable positions. FIGS. 11A and 11B show exemplary connection states of multiple arms of the first arm structure 1410 and multiple arms of the second arm structure 1420 according to the embodiment. Specifically, FIG. 11A shows a connection state of a first arm to a third arm of the first arm structure 1410, and FIG. 11B shows a connection state of a fourth arm to a sixth arm of the second arm structure 1420.

FIGS. 10A to 11B, for example, the first arm structure 1410 includes: a fixed first arm 1411; a second arm 1413 that is movable with respect to the first arm 1411; and a third arm 1415 that is movable with respect to the second arm 1413. For example, the second arm structure 1420 includes: a fixed fourth arm 1421; a fifth arm 1423 that is movable with respect to the fourth arm 1421; and a sixth arm 1425 that is movable with respect to the fifth arm 1423.

For example, the length adjustment unit may include: a first connection belt 1451 connecting a first end portion of the first arm 1411, a second end portion of the second arm 1413 and a first end portion of the third arm 1415; a second connection belt 1453 connecting a second end portion of the first arm 1411, a first end portion of the second arm 1413 and a second end portion of the third arm 1415; a third connection belt 1455 connecting a first end portion of the fourth arm 1421, a second end portion of the fifth arm 1423 and a first end portion of the sixth arm 1425; a fourth connection belt 1457 connecting a second end portion of the fourth arm 1421, a first end portion of the fifth arm 1423 and a second end portion of the sixth arm 1425; a sixth motor 1460; and a third connection structure 1470 connecting the first arm structure 1410 and the second arm structure 1420 with the sixth motor 1460.

With the configuration of the length adjustment unit, when the rotational force from the sixth motor 1460 is transmitted to the first arm structure 1410 and the second arm structure 1420, the first arm 1411, the second arm 1413 and the third arm 1415 are moved in conjunction with the fourth arm 1421, the fifth arm 1423 and the sixth arm 1425 between the original positions and the maximum extendable positions through the first connection belt 1451 to the fourth connection belt 1457.

The configuration of the above-described length adjustment unit is merely an example and is not limited thereto as long as the length of the first arm structure 1410 and the length of the second arm structure 1420 can be adjusted.

Figure 12:
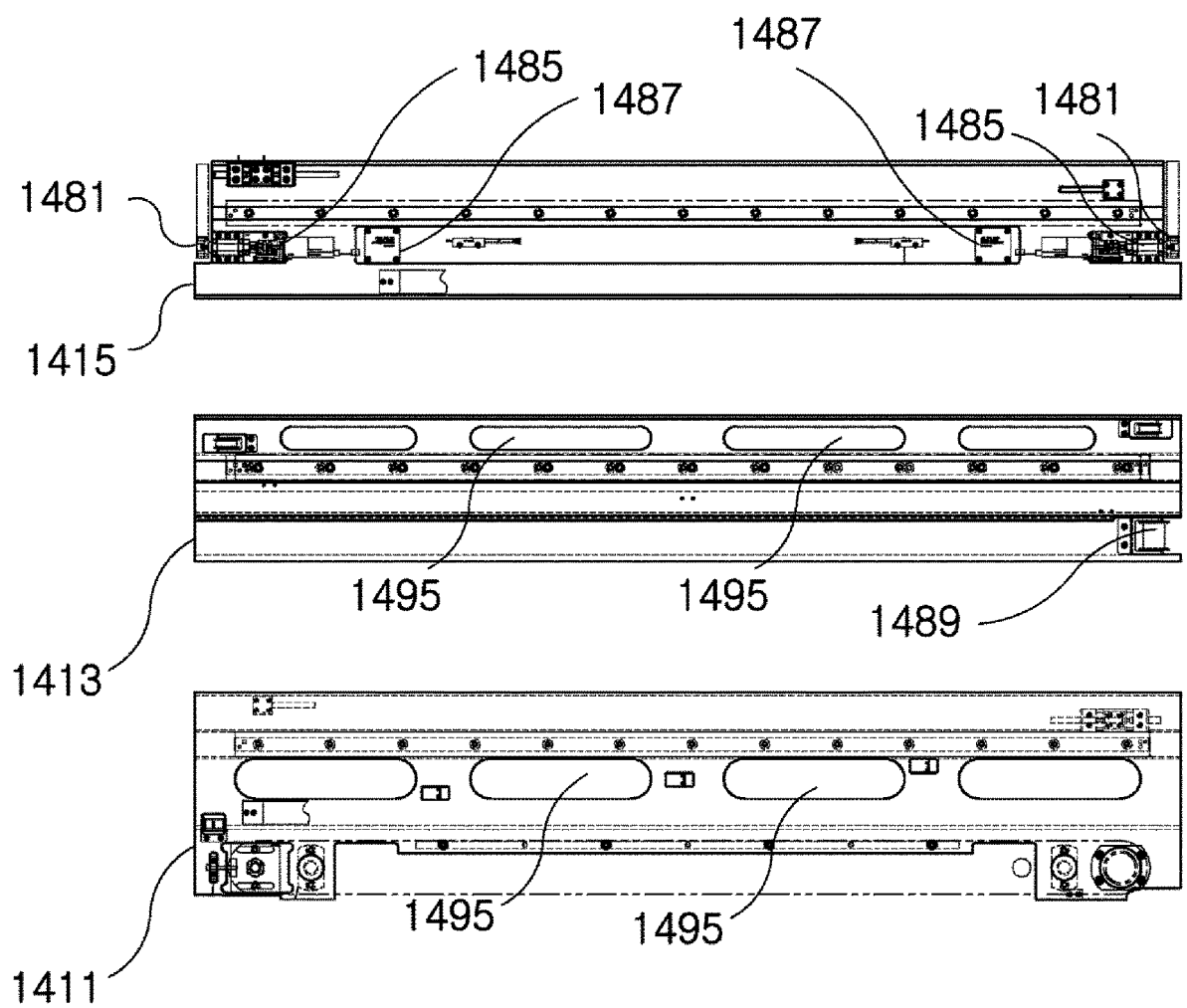
FIG. 12 shows an example of the multiple arms of the first arm structure according to the embodiment.

FIG. 12 shows an example of the multiple arms of the first arm structure 1410 according to the embodiment and is a side view of each of the first arm to the third arm.

Although the first arm 1411, the second arm 1413, and the third arm 1415 being connected to each other are driven, each of them is illustrated in FIG. 12 for the sake of convenience of description. Although there are some differences between the first arm structure 1410 and the second arm structure 1420, the second arm structure 1420 has substantially the same configuration as the first arm structure 1410. Thus, a detailed description of the second arm structure 1420 will be omitted.

Referring to FIG. 12, at least one of the first arm 1411, the second arm 1413, and the third arm 1415 includes one or more openings 1495. The openings 1495 are formed to reduce the weight of at least one of the first arm 1411, the second arm 1413 and the third arm 1415. Since the weight of the first arm structure 1410 including the first arm 1411, the second arm 1413 and the third arm 1415 is reduced by providing the openings 1495, it becomes possible to minimize the bending of the first arm 1411, the second arm 1413 and the third arm 1415 due to their weights and, further, power consumption for driving the first arm structure 1410 may also be minimized.

Referring to FIG. 12, for example, the loading unit 1400 includes: a first contact part 1481 provided on the third arm 1415; a second contact part 1483 provided on the sixth arm 1425; a first contact part driver 1485 configured to rotate the first contact part 1481 between an original position and a rotated position at which the first contact part 1481 comes into contact with the cargo 5000; and a second contact part driver (not shown) configured likewise as the first contact part driver 1485 to rotate the second contact part 1483 between an original position and a rotated position at which the second contact part 1483 comes into contact with the cargo 5000. Each of the first contact part 1481 and the second contact part 1483 may have a bar shape configured to be rotated by 90 degrees, for example. Each of the first contact part 1481 and the second contact part 1483 is also generally referred to as a "tine". In the original position, the contact between the first and second contact parts 1481 and 1483 and the cargo 5000 is released. In the rotated position at which the first contact part 1481 and the second contact part 1483 are rotated by 90 degrees as shown in FIG. 10B, the first contact part 1481 and the second contact part 1483 are in contact with the cargo 5000. Accordingly, by moving the first arm structure 1410 and the second arm structure 1420 to their original positions in a state where the first contact part 1481 and the second contact part 1483 are in contact with the cargo 5000, the cargo 5000 can be loaded onto the plate 1300. Similarly, by extending the first arm structure 1410 and the second arm structure 1420 in a state where the first contact part 1481 and the second contact part 1483 are in contact with the cargo 5000, the cargo 5000 can be unloaded from the plate 1300. Referring to FIG. 12, each of the first contact part driver 1485 and the second contact part driver (not shown) may include a component such as a motor.

Referring to FIG. 12, for example, the loading unit 1400 may further include: a first contact part controller 1487 provided on the third arm 1415 to control the first contact part driver 1485; a second contact part controller (not shown) configured likewise as the first contact part controller 1487 provided on the sixth arm 1425 to control the second contact part driver; a third cableveyor 1489 provided in the first arm structure 1410 and connected to the first contact part driver 1485 or the first contact part controller 1487; and a fourth cableveyor (not shown) configured likewise as the third cableveyor 1489 provided in the second arm structure 1420 and connected to the second contact part driver or the second contact part controller.

The first contact part controller 1487 and the second contact part controller are implemented using semiconductor devices and control the first contact part driver 1485 and the second contact part driver, respectively. Disposing the first contact part controller 1487 and the second contact part controller on the third arm 1415 and the sixth arm 1425, respectively, is to minimize the burden of cable connection. In other words, even though the cableveyors are used, the number of cables that can be accommodated in each cableveyor is limited and the length of the cable is also limited. Therefore, by arranging the first contact part controller 1487 and the second contact part controller for respectively controlling the first contact part driver 1485 and the second contact part driver close to the first contact part driver 1485 and the second contact part driver, cables for the first contact part driver 1485 and cables for the second contact part driver may be mainly disposed in the third cableveyor 1489 and the fourth cableveyor, respectively. Accordingly, the number of the cables and the lengths of the cables in each of the third cableveyor 1489 and the fourth cableveyor can be minimized. Thus, the possibility of malfunction, such as the possibility of damage to the cable, can be minimized.

The configuration of the above-described loading unit 1400 is merely an example and is not limited thereto as long as the cargo 5000 can be loaded or unloaded.

Figure 13A:
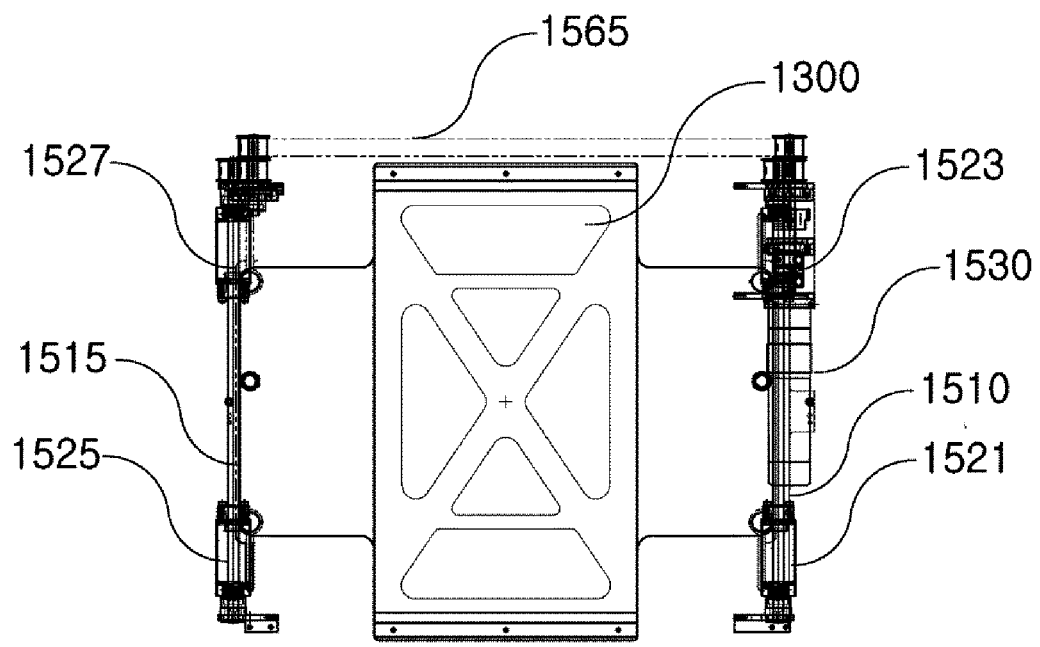
FIGS. 13A to 13C show an exemplary configuration of a plate lifting unit of the cargo transporting vehicle according to the embodiment.
Figures 13B, 13C:
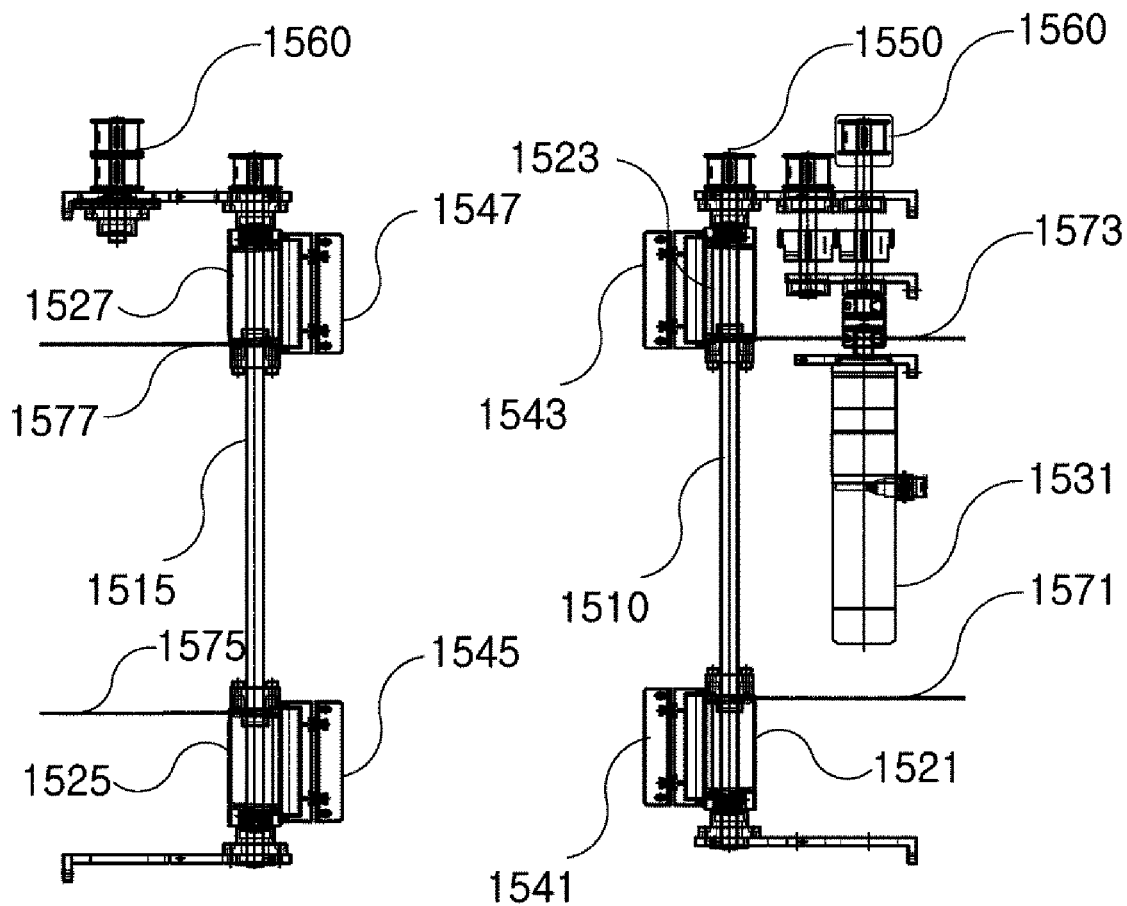

FIGS. 13A to 13C show an exemplary configuration of the plate lifting unit 1500 of the cargo transporting vehicle 1000 according to the embodiment. Specifically, FIG. 13A is a plan view of the plate lifting unit 1500 of the cargo transporting vehicle 1000, FIG. 13B is a side view of the plate lifting unit 1500, and FIG. 13C is another side view of the plate lifting unit 1500.

Referring to FIGS. 13A to 13C, for example, the plate lifting unit 1500 includes: a plurality of wires connected to the plate 1300; and a wire driving unit configured to raise or lower the plate 1300 by raising or lowering the plurality of wires together.

More specifically, the plurality of wires may include a first wire 1571, a second wire 1573, a third wire 1575 and a fourth wire 1577. Further, for example, the wire driving unit may include: a first wire shaft 1510 and a second wire shaft 1515; a first drum 1521 for winding the first wire 1571 therearound and a second drum 1523 for winding the second wire 1573 therearound that are provided at the first wire shaft 1510; a third drum 1525 for winding the third wire 1575 therearound and a fourth drum 1527 for winding the fourth wire 1577 therearound that are provided at the second wire shaft 1515; and a rotation driver configured to rotate the first wire shaft 1510 and the second wire shaft 1515.

For example, the rotation driver may include: a wire drive motor 1531; a first wire shaft connection structure 1550 connecting the wire drive motor 1531 and the first wire shaft 1510; and a second wire shaft connection structure 1560 connecting the wire drive motor 1531 and the second wire shaft 1515. The second wire shaft connection structure 1560 may include, for example, a timing pulley 1565. The first wire shaft connection structure 1550 and the second wire shaft connection structure 1560 may be constituted by components such as pulleys, gears and timing belts.

FIG. 14 shows a schematic configuration of the first drum 1521 to the fourth drum 1527 of the plate lifting unit 1500 according to the embodiment.

Referring to FIG. 14, for example, the first drum 1521 has a screw thread around which the first wire 1571 is to be wound, the second drum 1523 has a screw thread around which the second wire 1573 is to be wound, the third drum 1525 has a screw thread around which the third wire 1575 is to be wound, and the fourth drum 1527 has a screw thread around which the fourth wire 1577 is to be wound. As shown in FIG. 14, the screw thread around which the first wire 1571 is to be wound to the screw thread around which the fourth wire 1577 is to be wound are symmetrical with respect to, for example, an imaginary point and the positions at which the first wire 1571 to the fourth wire 1577 are wound around the first drum 1521 to the fourth drum 1527, respectively, are also symmetrical with respect to, for example, the imaginary point. By forming the screw threads on the first drum 1521 to the fourth drum 1527, the first wire 1571 to the fourth wire 1577 are raised or lowered together. Since the first wire 1571 to the fourth wire 1577 are raised or lowered together, the plate 1300 can be stably raised or lowered while minimizing any shaking.

Referring back to FIGS. 13B and 13C, for example, the wire driving unit may further include: a first wire guide 1541 for providing elasticity to prevent the first wire 1571 from jumping out of the first drum 1521; a second wire guide 1543 for providing elasticity to prevent the second wire 1573 from jumping out of the second drum 1523; a third wire guide 1545 for providing elasticity to prevent the third wire 1575 from jumping out of the third drum 1525; and a fourth wire guide 1547 for providing elasticity to prevent the fourth wire 1577 from jumping out of the fourth drum 1527. The first wire 1571 to the fourth wire 1577 are guided to the first drum 1521 to the fourth drum 1527 by the first wire guide 1541 to the fourth wire guide 1547, respectively, so that the first wire 1571 to the fourth wire 1577 can be stably wound or unwound on the first drum 1521 to the fourth drum 1527, respectively.

The configuration of the above-described plate lifting unit 1500 is merely an example and is not limited thereto as long as the cargo 5000 can be stably raised or lowered.

Other Embodiments

Although various exemplary embodiments of the present disclosure have been described in detail, the above descriptions merely illustrates the technical idea of the present disclosure, and it will be understood by those skilled in the art to which this present disclosure belongs that various changes and modifications may be made without departing from the scope of the essential characteristics of the present disclosure.

Accordingly, the exemplary embodiments disclosed herein are not used to limit the technical idea of the present disclosure, but to explain the present disclosure, and the scope of the technical idea of the present disclosure is not limited by those embodiments. Therefore, the scope of protection of the present disclosure should be construed as defined in the following claims, and all technical ideas that fall within the technical idea of the present disclosure are intended to be embraced by the scope of the claims of the present disclosure.

According to the embodiments of the present disclosure, it is possible to provide a cargo transporting vehicle capable of easily performing the maintenance of the traveling unit, minimizing the possibility of damage to the traveling unit, and stably loading, unloading, or moving up and down cargos having different sizes.

What is claimed is:

1. A cargo transporting vehicle configured to travel along a path of a work site, the cargo transporting vehicle comprising:
 a traveling unit configured to travel on the path;
 a plate configured to load a cargo thereon;
 a loading unit including at least an articulated arm structure in which a width and an extendable length are adjusted according to dimensions of the cargo, the articulated arm structure being configured to load and unload the cargo onto and from the plate; and
 a plate lifting unit configured to raise or lower the plate, wherein
 the traveling unit includes a first driving unit,
  the first driving unit includes:
   a first motor;
   a pair of first wheels;
   a first connection structure for transmitting a rotational force from the first motor to the pair of first wheels; and
   a pair of second wheels disposed at a different position from a position of the pair of first wheels, and
  the first connection structure includes at least a first height adjustment mechanism configured to adjust a relative height of the first motor with respect to the pair of first wheels.

2. The cargo transporting vehicle of claim 1, wherein the first connection structure further includes:
 a first pulley connected to the first motor;
 a first wheel shaft connecting the pair of first wheels;
 a second pulley connected to the first wheel shaft; and
 a first timing belt connecting the first pulley and the second pulley, and wherein the first height adjustment mechanism is connected to the first motor and the first pulley to adjust a height of the first motor and a height of the first pulley.

3. The cargo transporting vehicle of claim 1, wherein the path includes a first path and a second path intersecting the first path,
the first driving unit is configured to travel on the first path,
the traveling unit further includes a second driving unit configured to travel on the second path,
the second driving unit includes:
   a second motor;
   a pair of third wheels;
   a second connection structure for transmitting a rotational force from the second motor to the pair of third wheels; and
   a pair of fourth wheels that has a same shape as the pair of third wheels and is disposed at a different position from a position of the pair of third wheels, and
wherein the second connection structure includes at least a second height adjustment mechanism configured to adjust a relative height of the second motor with respect to the pair of third wheels.

4. The cargo transporting vehicle of claim 3, wherein the second connection structure further includes:
   a third pulley connected to the second motor;
   a pair of second wheel shafts respectively connected to the pair of third wheels;
   a third wheel shaft connected between the pair of second wheel shafts;
   a plurality of universal joints connecting the third wheel shaft and the pair of second wheel shafts to respectively connect the pair of second wheel shafts to the pair of third wheels;
   a fourth pulley connected to the third wheel shaft; and
   a second timing belt connecting the third pulley and the fourth pulley,
   wherein the second height adjustment mechanism is connected to the second motor and the third pulley to adjust a height of the second motor and a height of the third pulley.

5. The cargo transporting vehicle of claim 3, wherein the second driving unit further includes a second driving unit lifter connected to the pair of third wheels and the pair of fourth wheels to raise or lower the pair of third wheels and the pair of fourth wheels between a traveling position and a storage position.

6. The cargo transporting vehicle of claim 5, wherein the second driving unit lifter includes:
   a third motor;
   a fourth motor;
   a first lifting structure connecting one of the third wheels and one of the fourth wheels and configured to raise or lower the one of the third wheels and the one of the fourth wheels between the traveling position and the storage position by using the third motor; and
   a second lifting structure connecting the other of the third wheels and the other of the fourth wheels and configured to raise or lower the other of the third wheels and the other of the fourth wheels between the traveling position and the storage position by using the fourth motor.

7. The cargo transporting vehicle of claim 1, wherein the articulated arm structure includes a first arm structure and a second arm structure disposed to face the first arm structure, and
wherein the loading unit further includes:
   a width adjustment unit configured to adjust a width between the first arm structure and the second arm structure; and
   a length adjustment unit configured to adjust a length of the first arm structure together with a length of the second arm structure.

8. The cargo transporting vehicle of claim 7, wherein the width adjustment unit includes:
   a fifth motor;
   a support shaft connected to the fifth motor;
   a first cableveyor connected to the first arm structure; and
   a second cableveyor connected to the second arm structure, and
   wherein the first arm structure and the second arm structure are connected to the support shaft so as to be driven together in a direction closer to each other or in a direction away from each other with a rotation of the fifth motor.

9. The cargo transporting vehicle of claim 8, wherein the support shaft includes:
   a first screw thread run in a first direction; and
   a second screw thread run in a second direction opposite to the first direction, and
   wherein the first arm structure is slidably disposed on the support shaft to move along the first screw thread, and the second arm structure is slidably disposed on the support shaft to move along the second screw thread.

10. The cargo transporting vehicle of claim 7, wherein the first arm structure includes: a fixed first arm; a second arm that is movable with respect to the first arm; and a third arm that is movable with respect to the second arm,
the second arm structure includes: a fixed fourth arm; a fifth arm that is movable with respect to the fourth arm; and a sixth arm that is movable with respect to the fifth arm,
the length adjustment unit includes:
   a first connection belt connecting a first end portion of the first arm, a second end portion of the second arm and a first end portion of the third arm;
   a second connection belt connecting a second end portion of the first arm, a first end portion of the second arm and a second end portion of the third arm;
   a third connection belt connecting a first end portion of the fourth arm, a second end portion of the fifth arm and a first end portion of the sixth arm;
   a fourth connection belt connecting a second end portion of the fourth arm, a first end portion of the fifth arm and a second end portion of the sixth arm;
   a sixth motor; and
   a third connection structure connecting the first arm structure and the second arm structure with the sixth motor, and
when a rotational force from the sixth motor is transmitted to the first arm structure and the second arm structure, the first arm, the second arm and the third arm are moved in conjunction with the fourth arm, the fifth arm and the sixth arm between original positions and the maximum extendable positions of the first arm structure and the second arm structure through the first connection belt to the fourth connection belt.

11. The cargo transporting vehicle of claim 10, wherein at least one of the first arm to the sixth arm includes one or more openings.

12. The cargo transporting vehicle of claim 10, wherein the loading unit further includes:

a first contact part provided on the third arm;
a second contact part provided on the sixth arm;
a first contact part driver configured to rotate the first contact part between an original position and a rotated position at which the first contact part comes into contact with the cargo; and
a second contact part driver configured to rotate the second contact part between an original position and a rotated position at which the second contact part comes into contact with the cargo.

13. The cargo transporting vehicle of claim 12, wherein the loading unit further includes:
    a first contact part controller provided on the third arm to control the first contact part driver;
    a second contact part controller provided on the sixth arm to control the second contact part driver;
    a third cableveyor provided in the first arm structure and connected to the first contact part driver or the first contact part controller; and
    a fourth cableveyor provided in the second arm structure and connected to the second contact part driver or the second contact part controller.

14. The cargo transporting vehicle of claim 1, wherein the plate lifting unit includes:
    a plurality of wires connected to the plate; and
    a wire driving unit configured to raise or lower the plate by raising or lowering the plurality of wires together.

15. The cargo transporting vehicle of claim 14, wherein the plurality of wires include: a first wire; a second wire; a third wire; and a fourth wire, and
    wherein the wire driving unit includes:
        a first wire shaft and a second wire shaft;
        a first drum for winding the first wire therearound and a second drum for winding the second wire therearound that are provided at the first wire shaft;
        a third drum for winding the third wire therearound and a fourth drum for winding the fourth wire therearound that are provided at the second wire shaft; and
        a rotation driver configured to rotate the first wire shaft and the second wire shaft.

16. The cargo transporting vehicle of claim 15, wherein the first drum has a screw thread around which the first wire is to be wound, the second drum has a screw thread around which the second wire is to be wound, the third drum has a screw thread around which the third wire is to be wound, and the fourth drum has a screw thread around which the fourth wire is to be wound.

17. The cargo transporting vehicle of claim 15, wherein the wire driving unit further includes:
    a first wire guide configured to provide elasticity to prevent the first wire from jumping out of the first drum;
    a second wire guide configured to provide elasticity to prevent the second wire from jumping out of the second drum;
    a third wire guide configured to provide elasticity to prevent the third wire from jumping out of the third drum; and
    a fourth wire guide configured to provide elasticity to prevent the fourth wire from jumping out of the fourth drum.

18. The cargo transporting vehicle of claim 15, wherein the rotation driver includes:
    a wire drive motor;
    a first wire shaft connection structure connecting the wire drive motor and the first wire shaft; and
    a second wire shaft connection structure connecting the wire drive motor and the second wire shaft.

* * * * *